United States Patent
Kim et al.

[11] Patent Number: 6,108,185
[45] Date of Patent: Aug. 22, 2000

[54] CIRCUIT BREAKER HAVING HALL EFFECT SENSORS

[75] Inventors: Edward E. Kim, Burlington; Esteban Santos, Farmington; Joseph Criniti, New Britain; Javier I. Larranaga, Bristol, all of Conn.

[73] Assignee: General Electric Company, Schenectady, N.Y.

[21] Appl. No.: 09/006,791

[22] Filed: Jan. 14, 1998

[51] Int. Cl.[7] ........................................... H02H 3/00
[52] U.S. Cl. .......................... 361/115; 361/102; 361/93.3
[58] Field of Search ................................. 361/93–102, 87, 361/42, 115; 335/18, 215; 336/233

[56] References Cited

U.S. PATENT DOCUMENTS

| | | | |
|---|---|---|---|
| 3,683,264 | 8/1972 | Schieman et al. | 363/58 |
| 4,672,501 | 6/1987 | Bilac et al. | 361/96 |
| 5,583,732 | 12/1996 | Seymour et al. | 361/93 |
| 5,615,075 | 3/1997 | Kim | 361/87 |
| 5,629,824 | 5/1997 | Rankin et al. | 361/57 |
| 5,682,287 | 10/1997 | Pollman et al. | 361/93 |

*Primary Examiner*—Michael J. Sherry
*Attorney, Agent, or Firm*—Cantor Colburn LLP; Carl B. Horton

[57] ABSTRACT

The load lugs electrically connecting circuit breakers employing electronic trip units with associated electrical distribution circuits are shaped to provide magnetic flux concentration to Hall effect current sensors within the electronic trip unit circuit. The Hall effect sensor is positioned within the shaped region of the load lug for optimum focus of the magnetic flux within each phase of a multi-phase electrical distribution system.

14 Claims, 3 Drawing Sheets

CIRCUIT BREAKER HAVING HALL EFFECT SENSORS

BACKGROUND OF THE INVENTION

Circuit interrupters currently employed within industrial electrical distribution systems include separable contacts arranged for interrupting circuit current on command from an electronic trip unit. Current transducers such as current transformers as described within U.S. Pat. No. 4,672,501 entitled "Circuit Breaker and Protective Relay Unit" are often used to provide the trip unit with sample indication of circuit current. Such current transformers require space within the circuit breaker enclosure and increase in size with respect to the circuit breaker ampere rating. The increased size results in an increase in the size of the circuit breakers used in higher ampere-rated applications.

Hall effect devices such as described in U.S. Pat. No. 5,615,075 entitled "AC/DC Current Sensor for a Circuit Breaker" are much smaller in size than current transformers and allow for reduced space within the circuit breaker enclosure. Such Hall effect devices require some sort of a magnetic flux enhancer or concentrator to increase the Hall effect response at a further increase in the overall cost of the circuit breaker components.

An additional problem with use of Hall effect devices, particularly within multi-phase circuits, is the sensitivity of the Hall effect device to the magnet flux developed within adjoining phases. An overcurrent occurrence within one phase, for example, could generate substantial magnetic flux to increase the sensitivity of the Hall effect device in an immediately adjacent phase resulting in a false indication of an overcurrent occurrence in the adjacent phase.

The purpose of the invention is to describe an arrangement whereby Hall effect devices can be used with multi-pole circuit breakers without incurring cost increases over standard current transformers and without being subject to interphasal magnetic conditions.

SUMMARY OF THE INVENTION

The load lugs electrically connecting circuit breakers employing electronic trip units with associated electrical distribution circuits are shaped to provide magnetic flux concentration to Hall effect current sensors within the electronic trip unit circuit. The Hall effect sensor is positioned within the shaped region of the load lug for optimum focus of the magnetic flux within each phase and for optimum shield of the Hall effect sensor in one phase from magnetic flux generated in the adjoining phases. The shaping of the load lugs eliminates the need of additional magnetic flux concentrators as well as obviating the further need of an interphasal magnetic shield.

DESCRIPTION OF THE PREFERRED EMBODIMENT

Figure 1:
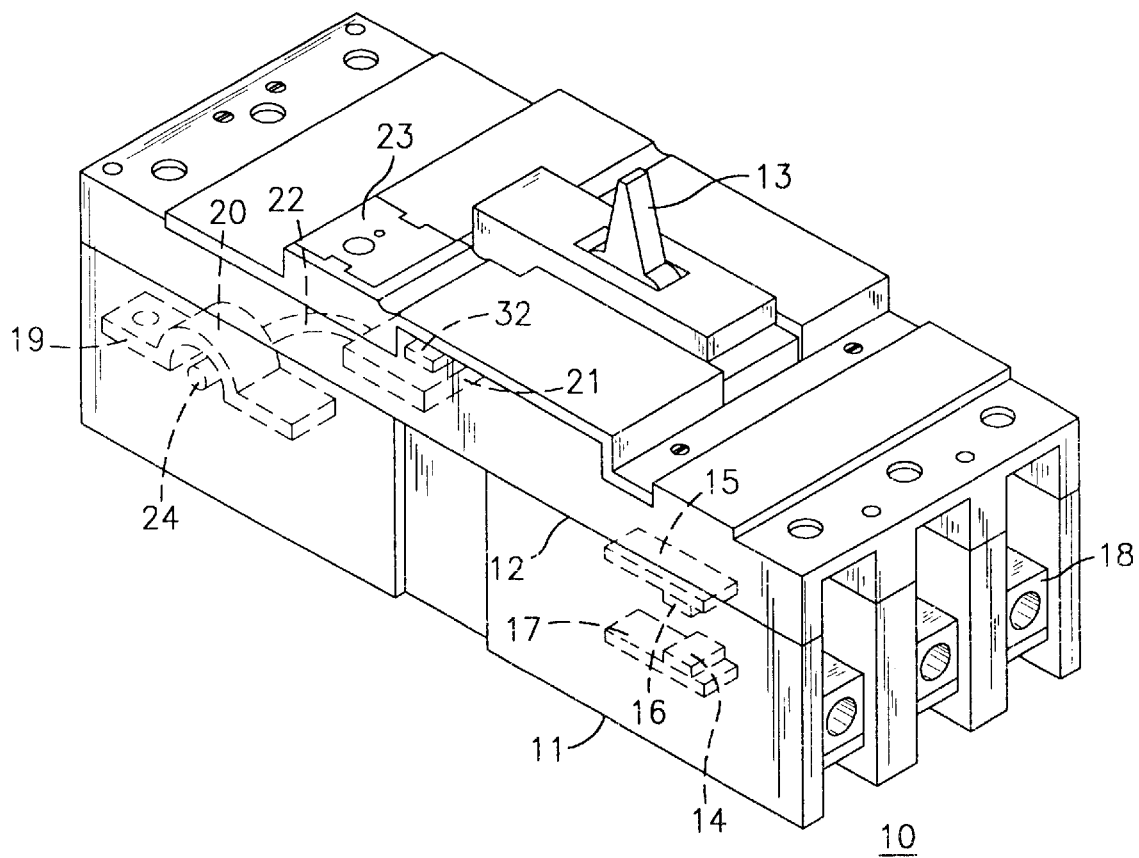
FIG. 1 is a top perspective view of a circuit breaker employing the flux concentration load lug and Hall effect sensor according to the invention.

A molded case circuit breaker 10 is depicted in FIG. 1 and includes a thermoset plastic case 11 to which a cover 12 of similar material is attached. A movable contact 14 on a movable contact arm 15 adjoins a fixed contact 16 on a contact support 17 for transport of circuit current between a line lug 18 and a load lug 19 within each phase of a three phase electrical distribution circuit. The ON and OFF conditions of the contacts are controlled by means of an electronic trip circuit 32 carried by a printed circuit board 21 located under the circuit breaker cover. The condition of the contacts is manually controlled by means of the operating handle 13 extending from the top surface of the cover. A rating plug 23 accessible from the top surface of the circuit breaker cover allows the ampere rating of the electronic trip circuit to be field-selectable as described in the aforementioned U.S. Pat. No. 4,672,501.

In accordance with the invention, the load lug 19 comprises a metallic strap shaped to form a central radial projection 20 within which the Hall effect device, hereinafter "Hall sensor" 24 is positioned. The Hall sensor is a type GH 600 obtained from F.W. Bell Co., Orlando, Fla. and connects with the trip circuit 32 by means of a pair of conductors, one of which is illustrated at 22, for inputting an electric signal to the trip circuit in proportion to the current flow through the load lug 19 in the manner described within the aforementioned U.S. Pat. No. 5,615,075.

Figure 2:
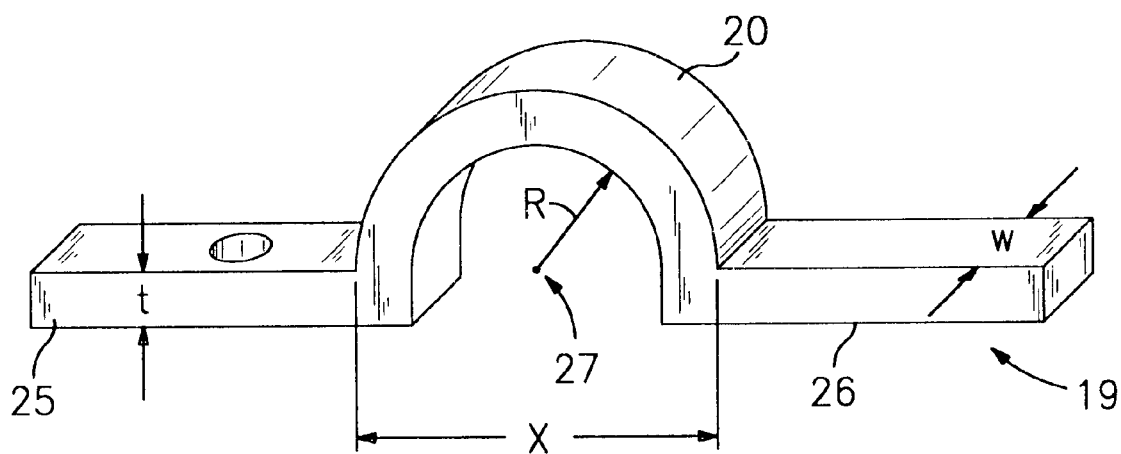
FIG. 2 is an enlarged top perspective view of the load lug within the circuit breaker of FIG. 1.

The load lug 19 is now depicted in FIG. 2 to illustrate the positioning of the radial projection 20 with respect to the front 25 and rear 26 portions of the load lug. It is thus seen that the thickness t and the width w of the load lug remains constant throughout the front, rear and radial projection thereof to insure a uniform magnetic flux distribution within the linear extent x defined about the center of the radius R.

Figure 3:
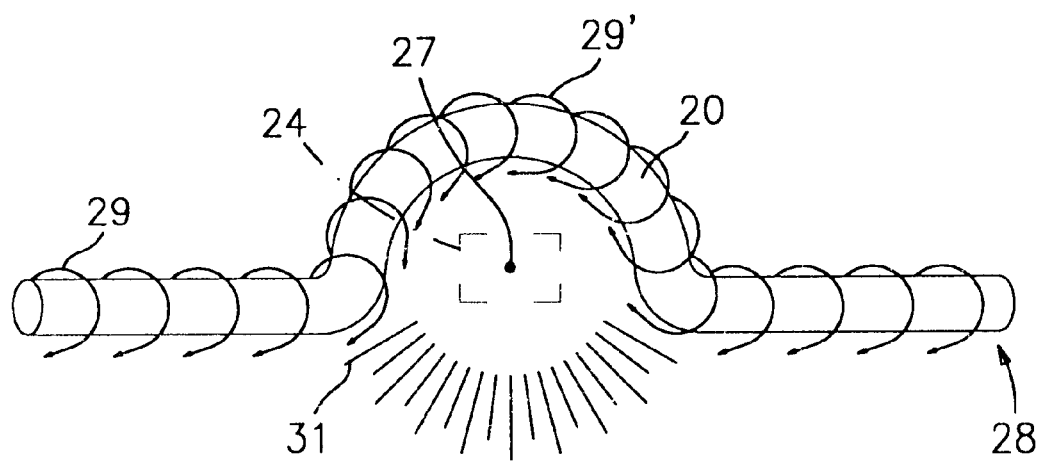
FIG. 3 is a diagrammatic representation of the flux density profile generated within the load lug upon the Hall effect sensor of FIGS. 1 and 2.

The magnetic flux lines 29 about a representative electrical conductor 28 having a defined radial projection 20 are illustrated in FIG. 3 wherein the Hall sensor 24, shown in phantom, is situated within the center 27 of the radial projection 20. The concentrated magnetic flux is illustrated by the number of flux lines 29' in the vicinity of the radial projection 20 producing the magnetic lines of force through the Hall sensor, as indicated at 31. It has been determined that not only is the magnetic flux increase within the radial projection 20, but the positioning of the Hall sensor within the radial projection 20 shields and protects the Hall sensor from stray magnetic fields produced by adjacent conductors in a manner similar to that provided by a Faraday cage.

Figure 4:
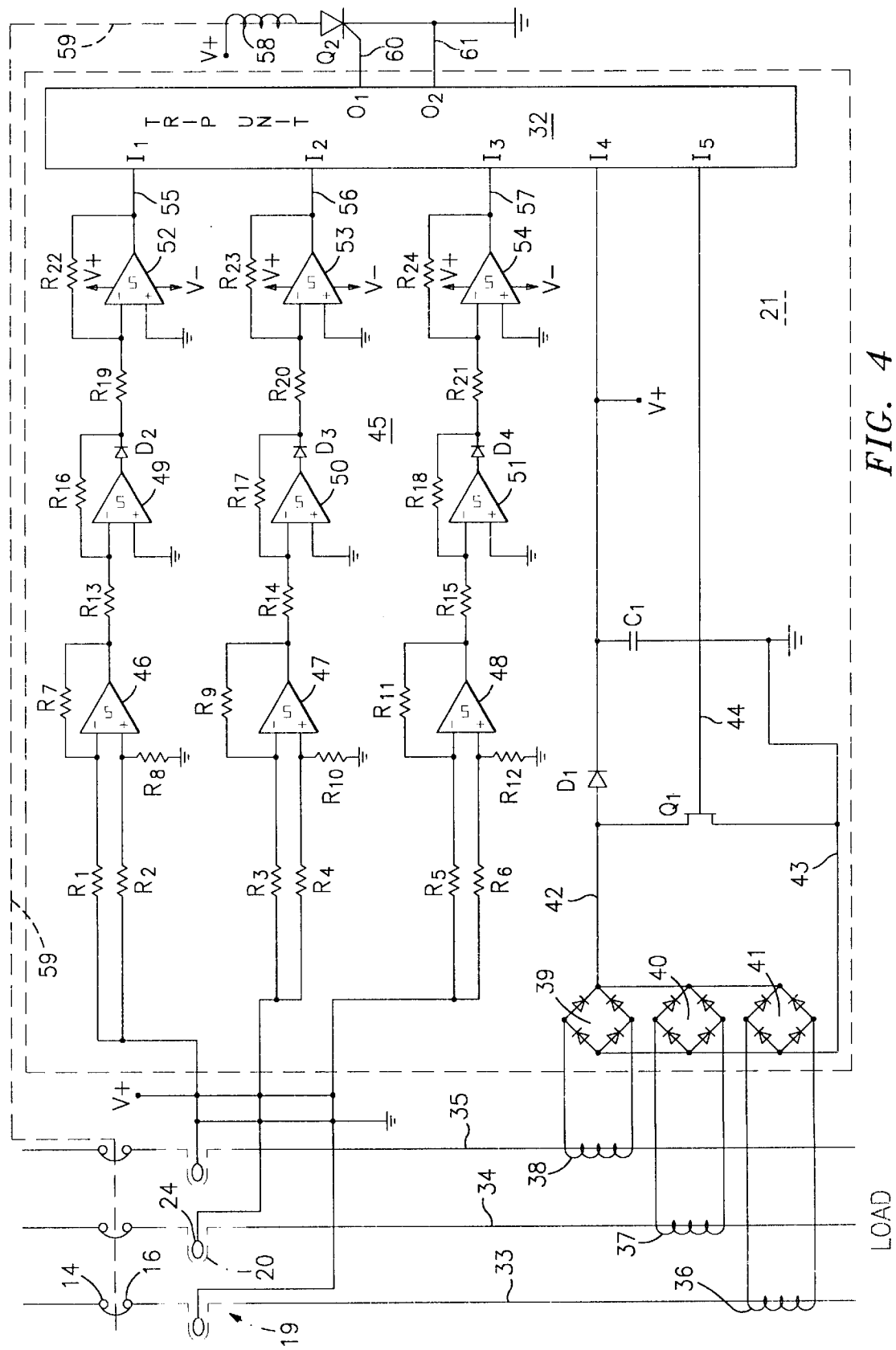
FIG. 4 is a diagrammatic representation of the printed circuit board carrying the conditioning circuit and trip unit circuit relative to the Hall effect sensors, contacts and current transformers contained within the circuit breaker of FIG. 1.

The electrical circuitry within the circuit breaker 10 of FIG. 1 is shown in FIG. 4 to include the printed circuit board 21 upon which the trip circuit 32 is mounted. The electric contacts 14, 16 are shown connected within a three phase electrical distribution system that includes conductors 33, 34, 35 and the shaped load lugs 19 depicted in phantom, encompass the corresponding Hall sensor 24 within the shaped radial projection 20 within each separate phase. Three miniature current transformers 36–38 are connected within each phase to provide operating power to input ports 14, 15 of the trip unit circuit 32 by means of three separate bridge rectifiers 39–41, conductors 42, 43 and 44, diode D1, FET Q1 and capacitor C1.

The conditioning circuit 45 connects between the Hall sensors 24 and the input ports $I_1$–$I_3$ of the trip unit and includes current limiting resistors R1-R6, feedback resistors R7, R9, R11 and ground resistors R8, R10, R12 connecting with the OP AMPs 46–48 in amplifying stage of the conditioning circuit. The OP AMPs 46–48 connect with OP AMPs 49–51 through limiting resistors R13–R15 and feedback resistors R16–R18 in the rectification stage and the OP AMPs 52–54 connect the input ports $I_1$–$I_3$ of the trip unit 32 through feed back resistors Rl9–R21, R22–R24, rectifying diodes D2–D4 and conductors 55–57 to complete the inverter stage of the conditioning circuit 45.

The signals inputted from the Hall sensors 24 through the conditioning circuit 45 are processed within the trip unit circuit 32 to determine instantaneous, short time and long time overcurrent conditions in the manner described within the recent aforementioned U.S. Pat. No. 5,615,075 and a trip signal is outputted over conductor 60 to the gate of switching transistor Q2 to energize the trip solenoid 58 via output port 01. The cathode of Q2 connects with ground through conductor 61 and output port 02 to complete the circuit to the trip solenoid. The solenoid operates over the connector 59 to separate the contacts 14, 16 within each of the conductors 33–35 to interrupt the circuit within each pole.

A circuit breaker of reduced component size and expense has herein been disclosed whereby a Hall sensor and supplemental miniature current transformer within each phase of a multi-phase circuit is able to both power up the circuit breaker electronic trip unit as well as provide sample current to the trip unit without magnetic interference between the respective Hall sensors within adjoining phases.

We claim:

1. A current sensor for circuit breakers employing an electronic trip unit comprising:
    a load lug electrically connected at a first end to an electrical distribution circuit and at a second end to an electrical contact;
    a shaped projection formed on said load lug intermediate said first end and said second end for concentrating magnetic flux within said shaped projection; and
    a Hall effect device positioned within said shaped projection for providing an electric signal to said electronic trip unit.

2. The current sensor of claim 1 wherein said load lug defines a rectangular cross section.

3. The current sensor of claim 1 wherein said shaped projection defines a radial configuration.

4. The current sensor of claim 1 wherein said shaped projection provides external magnetic shielding to said Hall effect device.

5. A circuit breaker comprising:
    a case and a cover;
    a first contact and a second contact defining a pair of separable electric contacts within said case, said contacts being arranged for connection within an electric circuit;
    a line lug at one end of said case, said line lug being connected with said first contact and being arranged for connection with an electrical distribution circuit;
    a load lug at an opposite end of said case, said load lug being connected with said second contact and arranged for connection with an electric load, said load lug shaped to define a magnetic flux concentrator projection thereon;
    an electronic trip unit circuit within said cover, said trip unit circuit being connected with a trip solenoid for separating said pair of electric contacts on the detection of overcurrent in said electric circuit; and
    a Hall effect device positioned within said magnetic flux concentrator, and connected to said electronic trip unit circuit for sampling current within said electric circuit and providing an electric signal to said electronic trip unit circuit.

6. The circuit breaker of claim 5 wherein said flux concentrator defines a shaped extension formed on said load lug intermediate one end and an opposite end thereof.

7. The circuit breaker of claim 5 wherein said load lug defines a rectangular cross section.

8. The circuit breaker of claim 6 wherein said shaped extension defines a radial configuration.

9. The circuit breaker of claim 6 wherein said shaped extension provides external magnetic shielding to said Hall effect device.

10. The circuit breaker of claim 5 including a conditioning circuit intermediate said Hall effect device and said trip unit.

11. The circuit breaker of claim 10 wherein said conditioning circuit includes an amplifier circuit.

12. The circuit breaker of claim 10 wherein said conditioning circuit includes a rectifier circuit.

13. The circuit breaker of claim 10 wherein said conditioning circuit includes an inverter circuit.

14. The circuit breaker of claim 5 further including a switching transistor intermediate said trip unit circuit and said trip solenoid for providing said trip signal to said trip solenoid upon receipt of a switching signal from said trip unit circuit.

* * * * *